United States Patent
Mizuta

[11] Patent Number: 6,016,061
[45] Date of Patent: Jan. 18, 2000

[54] CANTILEVER TYPE PROBE NEEDLE FOR PROBE CARD AND METHOD OF FABRICATION AND CONTROL THEREOF

[75] Inventor: Masaharu Mizuta, Hyogo, Japan

[73] Assignee: Mitsubishi Denki Kabushiki Kaisha, Tokyo, Japan

[21] Appl. No.: 09/013,921

[22] Filed: Jan. 27, 1998

[30] Foreign Application Priority Data

Jul. 24, 1997 [JP] Japan ................. 9-198500

[51] Int. Cl.⁷ ................. H01B 1/02; H01B 5/02
[52] U.S. Cl. ................. 324/762; 324/762
[58] Field of Search ................. 324/754, 762, 324/761, 72.5

[56] References Cited

U.S. PATENT DOCUMENTS 4,423,373  12/1983  LeCroy ................. 324/72.5
4,560,926  12/1985  Cornu et al. ................. 324/158 P
5,435,733  7/1995  Chernicky et al. ................. 439/68

FOREIGN PATENT DOCUMENTS 1-219566  9/1989  Japan .
4-351968  12/1992  Japan .

Primary Examiner—Josie Ballato
Assistant Examiner—Vincent Q Nguyen
Attorney, Agent, or Firm—McDermott, Will & Emery

[57] ABSTRACT

A probe needle for a probe card, and a method of fabrication and control thereof that prevents degradation in the reliability of a semiconductor device originating from an inspection process are provided. In a cantilever type probe needle for a probe card, a leading end of the probe needle is formed to include a first convex portion and a second convex portion separated from the first convex portion with a groove therebetween.

4 Claims, 15 Drawing Sheets

CANTILEVER TYPE PROBE NEEDLE FOR PROBE CARD AND METHOD OF FABRICATION AND CONTROL THEREOF

BACKGROUND OF THE INVENTION

1. Field of the Invention

The present invention relates to a probe needle for a probe card, and a method of fabrication and control thereof. More particularly, the present invention relates to a cantilever type probe needle for a probe card, and a method of fabrication and control thereof.

2. Description of the Background Art

In the conventional process of fabricating a semiconductor device, an apparatus called a probe card is used in checking the electrical characteristics of a semiconductor device. FIG. 20 is a sectional view for describing a conventional probe card. Referring to FIG. 20, a conventional probe card has an opening 114 formed substantially at the center of a substrate 113. A plurality of probe needles 115 are arranged at the periphery of opening 114 towards the center of opening 114. Probe needles 115 are connected to terminals (not shown) arranged at the periphery of substrate 113 via a wire. These terminals are connected to a tester device called a prober during the inspection of a semiconductor device. The probe card is placed facing the surface of the semiconductor device which is the subject of inspection so as to have the leading end of probe needle 115 arranged to come into contact with an electrode formed at the surface of the semiconductor device. The electrical characteristics of this semiconductor device is inspected through probe needle 115 in contact with the electrode formed at the surface of semiconductor device.

FIG. 21 is a schematic diagram for describing the conventional probe needle of FIG. 20. Referring to FIG. 21, the lead portion of the probe needle has a diameter D of approximately 0.25 mm. The length L of the leading end 101 of the probe needle is approximately 7 mm. The tip portion 102 of the probe needle that forms contact with the electrode of the semiconductor device under test has a diameter d of approximately 50 μm. Tungsten and the like is employed as the material of this probe needle.

The configuration of the leading end of a conventional probe needle will be described hereinafter with reference to the side views and perspective views of FIGS. 22–27.

FIGS. 22 and 23 show the configuration of the leading end of a conventional blast type probe needle. The tip 102 of the probe needle has substantially a plane configuration.

FIGS. 24 and 25 show the configuration of the leading end of a conventional specular type probe needle. The tip 102 of this probe needle has substantially a round configuration.

FIGS. 26 and 27 show the configuration of the leading end of a conventional spherical type probe needle. The substantially round configuration of tip 102 of this probe needle is formed to have a radius of curvature smaller than that of the specular type probe needle shown in FIGS. 24 and 25.

The contact process of a conventional probe needle with the electrode of a semiconductor device which is the subject of inspection in the process of checking the electrical characteristics of a semiconductor device will be described hereinafter with reference to the schematic diagrams of FIGS. 28 and 29.

Referring to FIG. 28, an electrode 105 formed at the surface of a semiconductor device 117 is brought into contact with tip 102 of the probe needle by elevating semiconductor device 117. Electrode 105 includes an aluminum layer 119 which is a conductor. An aluminum oxide layer 118 of approximately 30 Å in thickness is formed at the surface of aluminum layer 119. As an alternative to aluminum layer 119, an alloy layer of aluminum and copper may be employed. Since aluminum oxide layer 118 is an insulator, electrical connection cannot be established between tip 102 of the probe needle and aluminum layer 119 by just bringing tip 102 of the probe needle into contact with the surface of electrode 105 as shown in FIG. 28.

Accordingly, semiconductor device 117 is further elevated as shown in FIG. 19, whereby the probe needle is deformed in an elastic manner. Tip 102 of the probe needle is shifted laterally on electrode 105. This causes aluminum oxide layer 118 at the surface of electrode 105 to be scraped off the surface of electrode 105. As a result, direct contact can be provided between aluminum layer 119 which is the main body of electrode 105 and tip 102 of the probe needle. Thus, tip 102 of the probe needle forms contact with electrode 105 in the conventional inspection process.

The scraped aluminum oxide layer 118 at the surface of electrode 105 leaves a probe vestige 106 where aluminum layer 119 is exposed, as shown in FIG. 30. FIGS. 30 and 31 show the probe vestige corresponding to the blast type probe needle of FIGS. 22 and 23. FIG. 32 shows the probe vestige corresponding to the specular probe needle of FIGS. 24 and 25. FIG. 33 shows the probe vestige corresponding to the spherical type probe needle of FIGS. 26 and 27. Referring to FIGS. 30 and 31, a protuberant portion 116 originated from the aluminum oxide scraped away is formed around probe vestige 106. Protuberant portion 116 has a height of approximately 10 μm. Following the inspection process of this semiconductor device, electrode 105 is coupled to a bonding wire such as of gold by thermosonic bonding in order to be connected to a lead frame. As to this coupling, there is a problem that the bonding between electrode 105 and the bonding wire is degraded by protuberant portion 116 formed of aluminum oxide at the circumference of probe vestige 106 since the bonding between aluminum oxide and gold is weaker than the bonding between aluminum and gold. The bond between electrode 105 and the bonding wire is further aggravated if probe vestige 106 is greater in size. This is because the amount of aluminum oxide layer 118 scraped aside is proportional to the size of probe vestige 106, resulting in a greater protuberant portion 116 which is composed of the aluminum oxide. There was a problem that the reliability of the semiconductor device is degraded due to the insufficient bonding between the bonding wire and electrode 105.

Furthermore, if the scraped aluminum oxide adheres to tip 102 (refer to FIG. 29) of the probe needle, the contact between electrode 105 and tip 102 of the probe needle is obstructed. It will become difficult to properly transmit an electric signal between the probe needle and electrode 105. This will degrade the reliability of the inspection per se of the semiconductor device. As a result, the reliability of the quality of the fabricated semiconductor device will also be degraded.

SUMMARY OF THE INVENTION

An object of the present invention is to provide a probe needle of a probe card that can prevent degradation in the reliability of a semiconductor device originating in an inspection process.

Another object of the invention is to provide a probe needle of a probe card that can prevent degradation in the reliability of the quality of a semiconductor device by preventing reduction in the reliability of an inspection process.

A further object of the present invention is to provide a method of fabricating a probe needle to allow a probe needle of a probe card to be easily obtained that can prevent degradation in the reliability of a semiconductor device originating in an inspection process.

Still another object of the present invention is to provide a method of controlling a probe needle of a probe card that can effectively prevent degradation in the reliability of a semiconductor device originating from an inspection process.

According to an aspect of the present invention, a cantilever type probe needle of a probe card has a leading end including a first convex portion and a second convex portion formed apart from the first convex portion with a groove. Since the cantilever type probe needle for a probe card of the present application has a plurality of convex portions at the leading end, the size of the convex portion can be made smaller than that of the leading end of a conventional probe needle that has one convex portion. Therefore, the area of contact between the convex portion at the leading end of the probe needle and the surface of the electrode can be reduced. This means that the width of the probe vestige formed at the surface of the electrode when the electrode of the semiconductor device is brought into contact with the probe needle for the purpose of inspecting the semiconductor device can be made smaller. Since the area of contact between the probe needle and the surface of the electrode can be reduced by virtue of a smaller convex portion at the leading end of the probe needle, the pressure between the convex portion of the leading end of the probe needle and the electrode can be increased even when the load imposed on the probe needle is the same as that of the conventional probe needle. Even if the sliding distance of the probe needle on the electrode in the horizontal direction is set shorter than the conventional one, the aluminum oxide layer at the surface of the electrode can be removed to bring the probe needle into contact with the underlying aluminum layer. This means that the length of the probe vestige on the electrode can be made smaller. As a result, both the width and the length of the probe vestige can be reduced. The amount of aluminum oxide removed from the surface of the electrode is reduced, so that the protuberant portion of aluminum oxide formed around the probe vestige can be made smaller. In bonding a wire formed of gold to this electrode, the problem of degradation in the reliability of the semiconductor device caused by insufficient bonding between the bonding wire and the electrode can be eliminated.

Since the cantilever type probe needle of a probe card has a plurality of convex portions which are brought into contact with the electrode, an electric signal can be properly transmitted between the probe needle and the electrode even when the aluminum oxide scraped off the electrode adheres to one convex portion to result in insufficient contact between the electrode and that convex portion, as long as contact between the electrode and the other convex portion is maintained. It is therefore possible to prevent degradation in the reliability of the inspection per se for a semiconductor device.

According to another aspect of the present invention, a cantilever type probe needle for a probe card of a structure of the above aspect can have a convex portion of substantially a round configuration. The leading end of the probe needle can be prevented from projecting excessively into the electrode when the electrode of the semiconductor device is pressed against the probe needle by virtue of the round configuration of the convex portion. This prevents the occurrence of a problem where the tip of the probe needle damages another element of the semiconductor device located beneath the electrode in the inspection process.

The probe needle of the probe card according to the structure of the above aspect may have a convex portion of substantially a plane configuration. The tip of the probe needle can be effectively prevented from excessively projecting into the electrode when the electrode of the semiconductor device is pressed against the probe needle since the convex portion substantially has a plane configuration. Therefore, occurrance of the problem that the tip of the probe needle damages another element of the semiconductor device located beneath the electrode can be prevented effectively in the inspection process.

According to another aspect of the present invention, a method of fabricating a cantilever type probe needle of a probe card includes the steps of forming a groove at the leading end of the probe needle, and forming first and second convex portions spaced apart by the groove at the leading end of the probe needle. By the step of forming a plurality of convex portions at the leading end of the probe needle, the size of the convex portion can be made smaller than that of a conventional probe needle which has one convex portion. The area of contact between the convex portion at the leading end of the probe needle and the surface of the electrode can be reduced. Therefore, the width of the probe vestige formed at the surface of the electrode in forming contact between the electrode of the semiconductor device and the probe needle for inspecting the semiconductor device can be made smaller. A smaller convex portion of the leading end of the probe needle allows the area of contact between the probe needle and the surface of the electrode to be reduced. Therefore, the pressure between the convex portion at the leading end of the probe needle and the electrode can be increased even when the load exerted on the probe needle is the same as that of the conventional probe needle. Even when the sliding distance of the probe needle horizontally on the electrode is set shorter than the conventional one, the aluminum oxide layer at the surface of the electrode can be removed to provide contact between the underlying aluminum layer and the probe needle. It is therefore possible to reduce the length of the probe vestige on the electrode. Thus, both the width and the length of the probe vestige can be reduced. This means that the amount of aluminum oxide removed from the surface of the electrode can be reduced. As a result, the protuberant portion of aluminum oxide formed at the circumference of the probe vestige can be made smaller. It is therefore possible to prevent the problem of degradation in the reliability of semiconductor device caused by insufficient bonding between the bonding wire formed of gold and the electrode.

By virtue of the plurality of convex portions at the probe needle in contact with the electrode, an electric signal can be transmitted properly between the probe needle and the electrode even when the aluminum oxide scraped off the electrode adheres to one convex portion to cause insufficient contact between the electrode and that convex portion, as long as the contact between the electrode and the other convex portion is maintained. It is therefore possible to prevent the reliability of the inspection per se of the semiconductor device from being degraded.

The method of fabricating a cantilever type probe needle for a probe card of the above aspect can include the step of forming the groove using laser processing. The usage of laser processing for formation of the groove allows a groove to be formed that is more minute than the case carried out by machining using a cutting tool by virtue of reducing the size of the focal point of the laser beam.

The method of fabricating a cantilever type probe needle for a probe card according to the above aspect can include a working step so that the convex portion has substantially a round configuration by projecting the first and second convex portions at the leading end of the probe needle into an abrasive member including abrasive grains. The configuration of the convex portion can easily be made round by projecting the convex portion into the abrasive member in the working step of the convex portion. Furthermore, the size of the round configuration of the convex portion can easily be set by controlling the number of times the convex portion is projected into the abrasive member.

According to still another aspect of the present invention, a method of controlling a relative movement between a surface of a semiconductor device and a cantilever type probe needle having at its leading end a first convex portion and a second convex portion formed with a groove therebetween includes the step of contacting both first and second convex portions with the surface of the semiconductor device. Therefore, the contact between the semiconductor device and the probe needle is reliable as long as the contact between the second convex portion and the contacting area is maintained even when the contact between the first convex portion and the contacting area fails. Degradation in the accuracy of the inspection process of the semiconductor device using the probe needle caused by defective contact between the probe needle and the semiconductor device can be prevented. It is therefore possible to prevent degradation in the reliability of the inspection itself for the semiconductor device.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention will be described hereinafter with reference to the drawings.

First Embodiment

Figure 1:
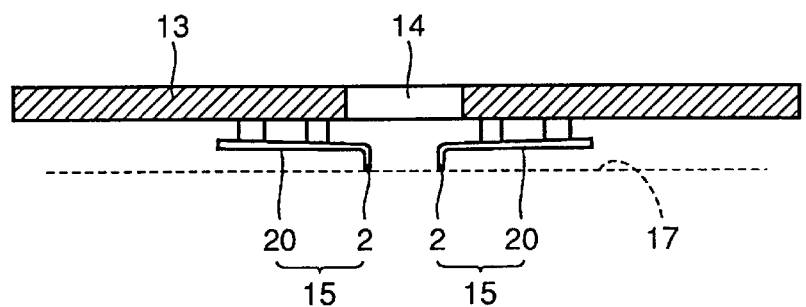
FIG. 1 is a sectional view of a probe card employing a probe needle according to a first embodiment of the present invention.
Figure 29:
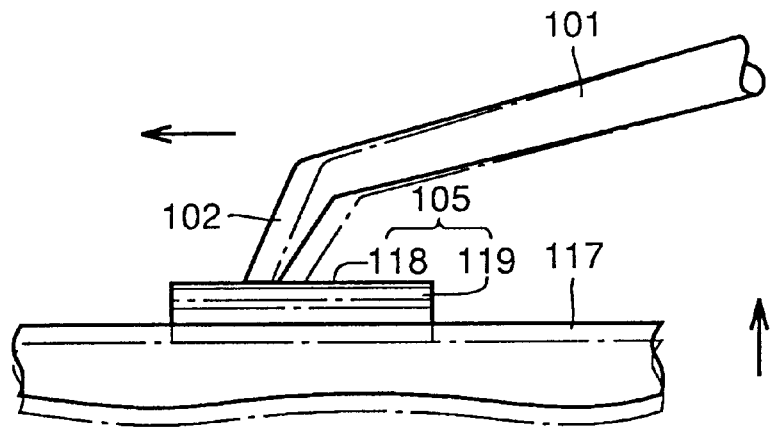

Referring to FIG. 1, a probe card employing a probe needle according to a first embodiment of the present invention has an opening 14 formed substantially at the center of a substrate 13. A plurality of probe needles 15 are arranged towards and at the periphery of opening 14. Probe needle 15 is connected to a terminal (not shown) arranged at the periphery of substrate 13 via a wire. A lead portion 20 of probe needle 15 is arranged so as to be parallel to the surface 17 of a semiconductor substrate where the semiconductor device which is the subject of inspection is formed. Since lead portion 20 of probe needle 15 is parallel to surface 17 of the semiconductor substrate, probe needle 15 is deformed in an elastic manner by pressing the electrode of the semiconductor device towards probe needle 15 as shown in FIG. 29, so that the distance of travel of the leading end of probe needle 15 in the horizontal direction can be reduced. As a result, the probe vestige formed on the electrode becomes smaller. As shown in FIG. 1, the tip 2 of probe needle 15 is formed to have an angle of approximately 90 degrees to the surface 17 of the semiconductor substrate when in contact.

Figure 2:
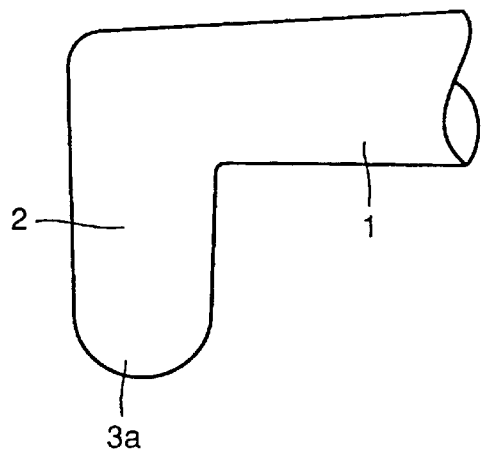
FIGS. 2 and 3 are a side view and a bottom view, respectively, for describing the leading edge of the probe needle according to the first embodiment.
Figure 3:
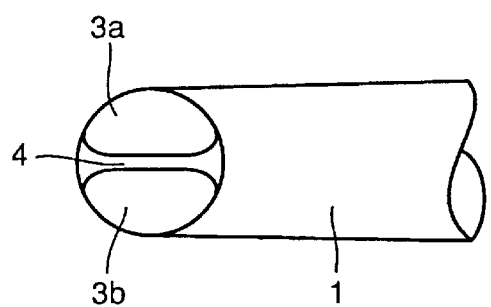
Figure 4:
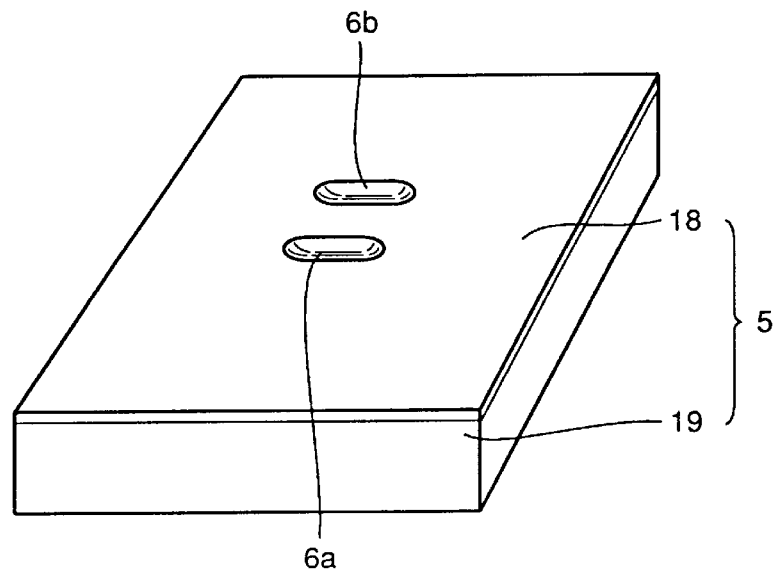
FIG. 4 is a schematic diagram for describing a probe vestige formed by the probe needle of the first embodiment on an electrode of a semiconductor device.
Figure 28:
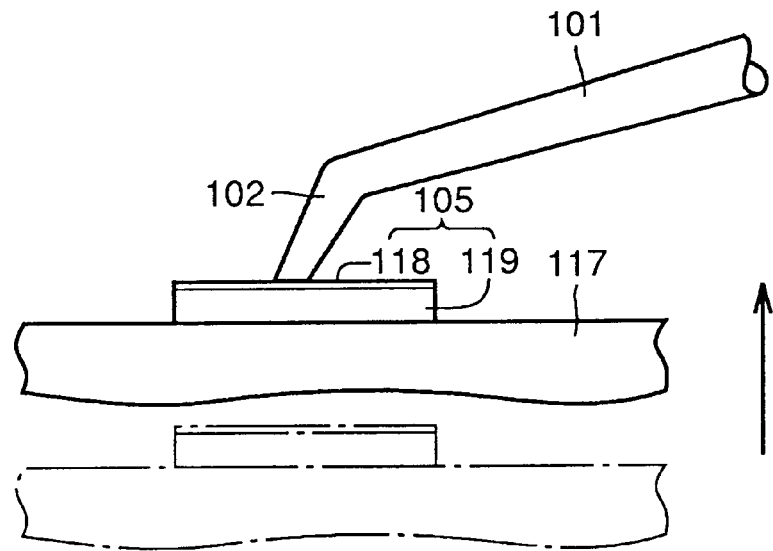
FIGS. 28 and 29 are schematic diagrams for describing a first step of a contact process between the blast type probe needle of FIG. 22 and an electrode of a semiconductor device in inspecting the electrical characteristics of the semiconductor device using the blast type probe needle.
Figure 30:
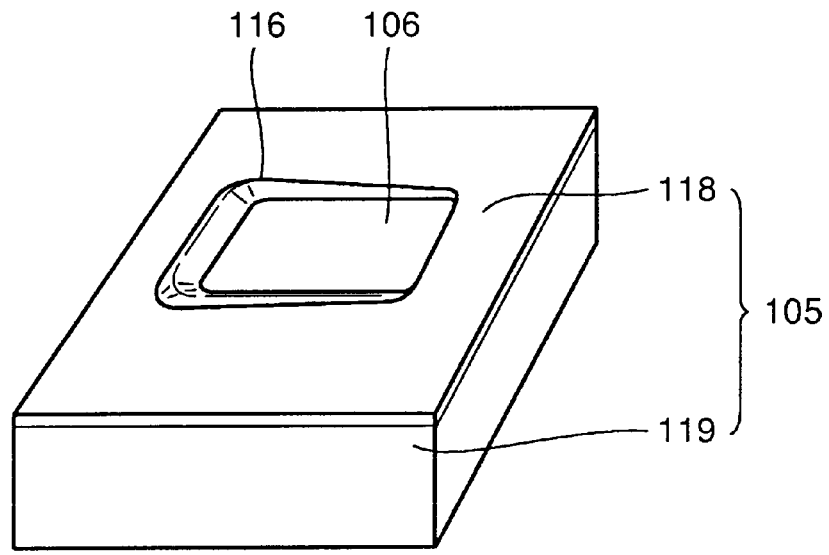
FIGS. 30 and 31 are a schematic diagram and a side view, respectively, for describing a probe vestige formed on an electrode by the conventional blast type probe needle of FIG. 22.
Figure 31:
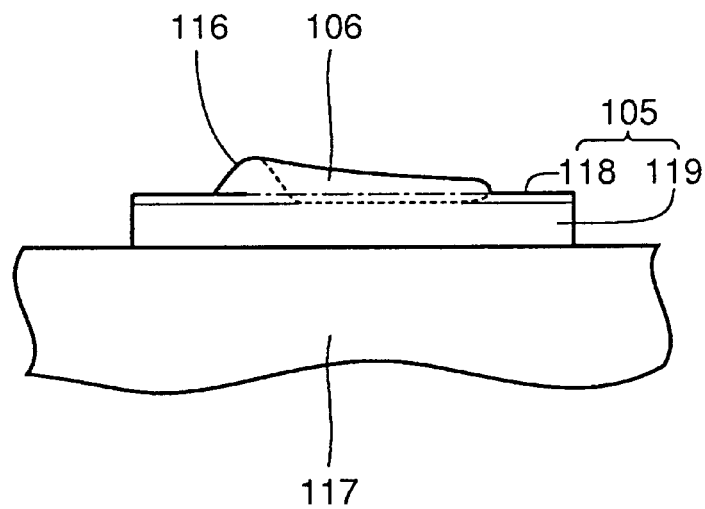
Figure 32:
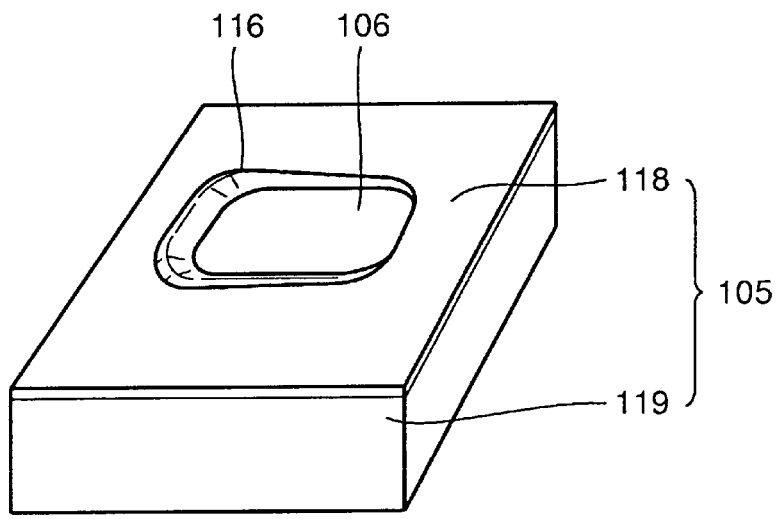
FIGS. 32 and 33 are schematic diagrams for describing a probe vestige formed on an electrode by the conventional specular type and spherical type probe needles shown in FIGS. 24 and 26, respectively.
Figure 33:
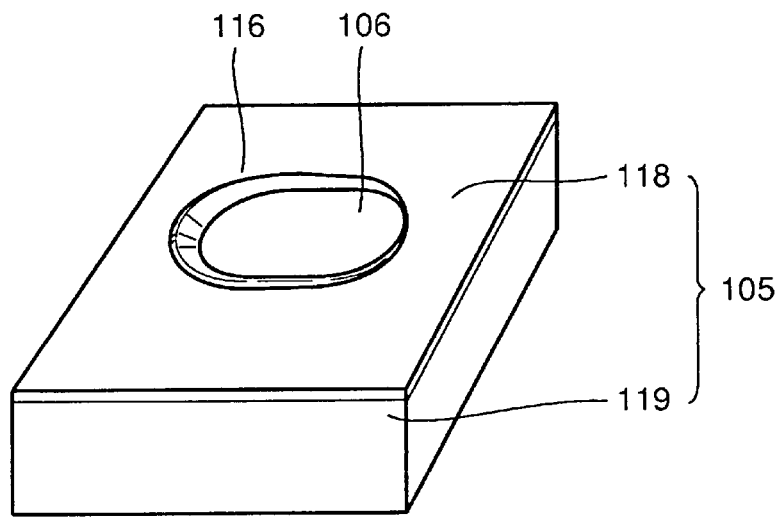

Referring to FIGS. 2 and 3, tip 2 of the cantilever type probe needle of the first embodiment includes a first convex portion 3a, a groove portion 4, and a second convex portion 3b. The first and second convex portions 3a and 3b have substantially a round configuration. This structure of tip 2 of the probe needle allows the size of convex portions 3a and 3b to be reduced more than the convex portion of a conventional probe needle with one convex portion. More specifically, considering a cross section of first and second convex portions 3a and 3b taken orthogonal to groove 4, the radius of curvature of the leading end of convex portions 3a and 3b can be made smaller than that of the convex portion of a conventional probe needle. Accordingly, the width of probe vestiges 6a and 6b formed at the surface of electrode 5 of a semiconductor device can be made smaller as shown in FIG. 4 when the electrode of the semiconductor device is brought into contact as shown in FIGS. 28 and 29 with convex portions 3a and 3b (refer to FIG. 3) located at tip 2 of the probe needle. Here, electrode 5 is formed of an aluminum layer 19. An aluminum oxide layer 18 is formed at the surface thereof. A smaller size of convex portions 3a and 3b of the probe needle allows the area of contact between convex portions 3a and 3b of the probe needle and the surface of electrode 5 to be reduced. Even if the load exerted on the probe is the same as that of the conventional prove needle, the pressure at the contact between convex portions 3a and 3b of the probe needle and the surface of electrode 5 can be increased. Even if the distance of travel of the probe needle in the horizontal direction on electrode 5 is set smaller than a conventional one, aluminum oxide layer 18 at the surface of electrode 5 can be removed to form contact between the underlying aluminum layer 19 and convex portions 3a and 3b. The distance of travel of the probe needle on electrode 5 can be reduced to allow a shorter length of probe vestiges 6a and 6b on electrode 5. As a result, both the width and the length of probe vestiges 6a and 6b can be reduced. Therefore, protuberant portion 116 (refer to FIG. 30) of aluminum oxide formed at the circumference of probe vestige 6a and 6b can be reduced. Thus, the problem of reduction in the reliability of the semiconductor device originated from insufficient bonding between a bonding wire and electrode 5 can be prevented.

Since the probe needle of the first embodiment has the first and second convex portions 3a and 3b brought into contact with electrode 5, the contact between electrode 5 and the probe needle can be ensured even in the case where the aluminum oxide scraped from electrode 5 adheres to first convex portion 3a to degrade the contact therebetween, as long as the contact between the second convex portion 3b and electrode 5 is maintained. Therefore, degradation in the accuracy of inspection caused by insufficient contact between the probe needle and the electrode in the process of inspecting a semiconductor device with the probe needle can be prevented. It is possible to prevent the reliability of the inspection per se of the semiconductor device from degrading. Although the contact between the probe needle and electrode 5 is provided by a manner identical to the conventional manner as shown in FIGS. 28 and 29, another way of contact can be carried out. For example, after bringing electrode 5 into contact with the probe needle, the probe needle may be oscillated at a constant amplitude in the horizontal direction or vertical direction with a constant load exerted on the probe needle. The load exerted on the probe needle is preferably approximately 1–10 g with an amplitude of approximately 1–10 μm. Alternatively, the semiconductor device can be oscillated instead of the probe needle.

A method of fabricating a probe needle according to the first embodiment of the present invention will be described hereinafter with reference to FIGS. 5–8.

Figure 5:
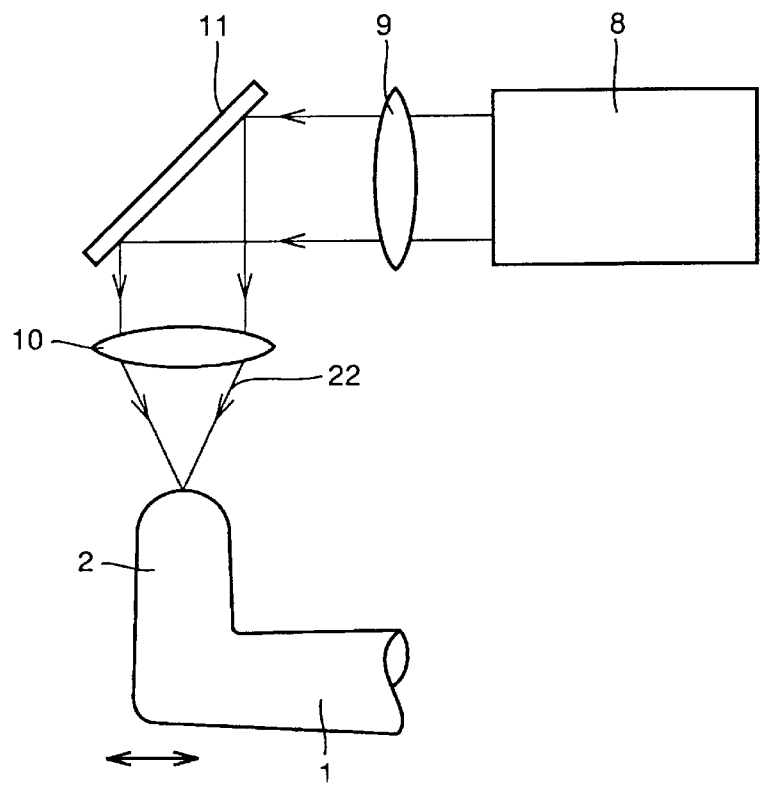
FIG. 5 is a schematic diagram for describing a first step of a fabrication process of a probe needle according to the first embodiment shown in FIG. 2.
Figure 6:
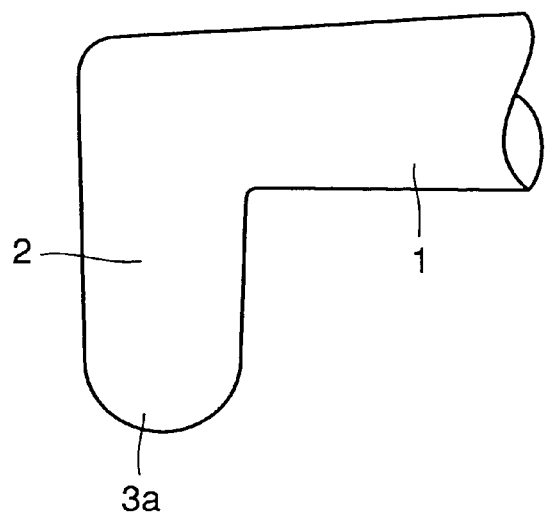
FIGS. 6 and 7 are a side view and a bottom view, respectively, for describing the leading end of a probe needle obtained by the first step of the fabrication process of the first embodiment shown in FIG. 5.
Figure 7:
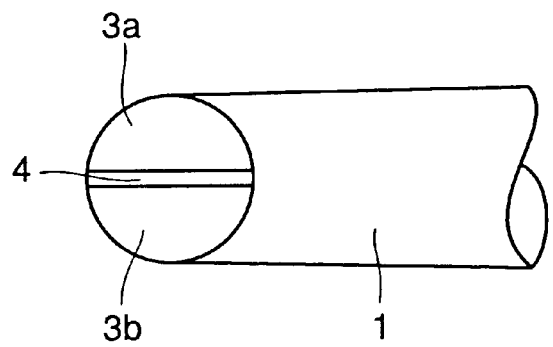

Referring to FIG. 5, control is provided so that the laser beam 22 generated by a laser beam oscillator 8 is focused at a predetermined position by lens 9 and 10 and a reflective mirror 11. Excimer laser and the like can be used for the laser beam. The position of the probe needle is controlled so that the area of tip 2 of the probe needle where groove 4 is to be formed is located at the position where the focus in obtained. As shown in FIGS. 6 and 7, groove 4 is formed at tip 2 of the probe needle. Groove 4 is provided so as to separate convex portions 3a and 3b.

Figure 8:
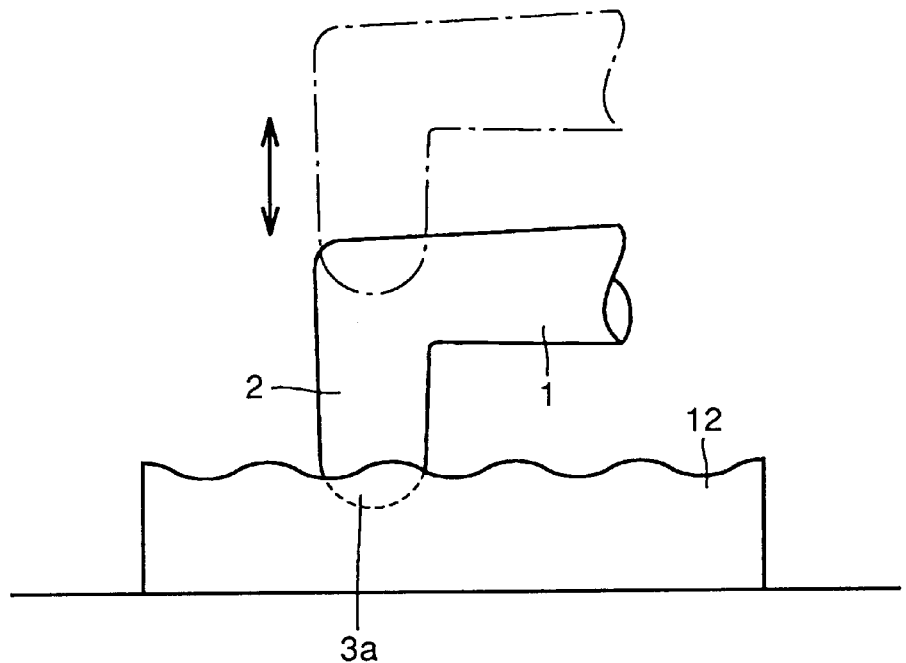
FIG. 8 is a schematic diagram for describing a second step of the fabrication process of the probe needle according to the first embodiment shown in FIG. 2.

After the step of FIG. 5, the step of FIG. 8 is carried out. Tip 2 of the probe needle is projected into an abrasive member 12 formed of a resin including abrasive grains therein. As a result, convex portions 3a and 3b of tip 2 are ground to result in substantially a round configuration. Thus, tip 2 of the cantilever type probe needle of the first embodiment shown in FIGS. 2 and 3 is formed. Abrasive member 12 has a hardness of a level that allows tip 2 of the probe needle to be projected therein and contains abrasive grains. For example, rubber containing abrasive grains, or a metal or ceramics of a hardness lower than that of the material of the probe needle with abrasive grains mixed therein can be used. In the first embodiment, convex portions 3a and 3b are made to have a round configuration by projecting tip 2 of the probe needle into abrasive member 12. Alternatively, convex portions 3a and 3b can be rounded by chemical polishing.

Second Embodiment

Figure 9:
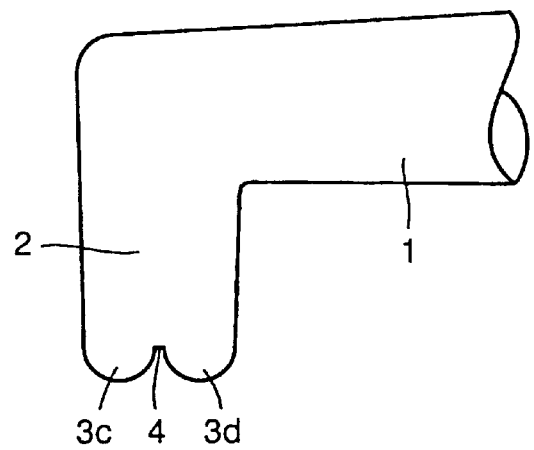
FIGS. 9 and 10 are a side view and a bottom view, respectively, for describing the leading end of a probe needle according to a second embodiment of the present invention.
Figure 10:
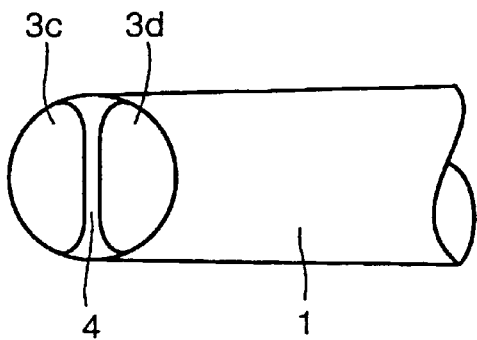
Figure 11:
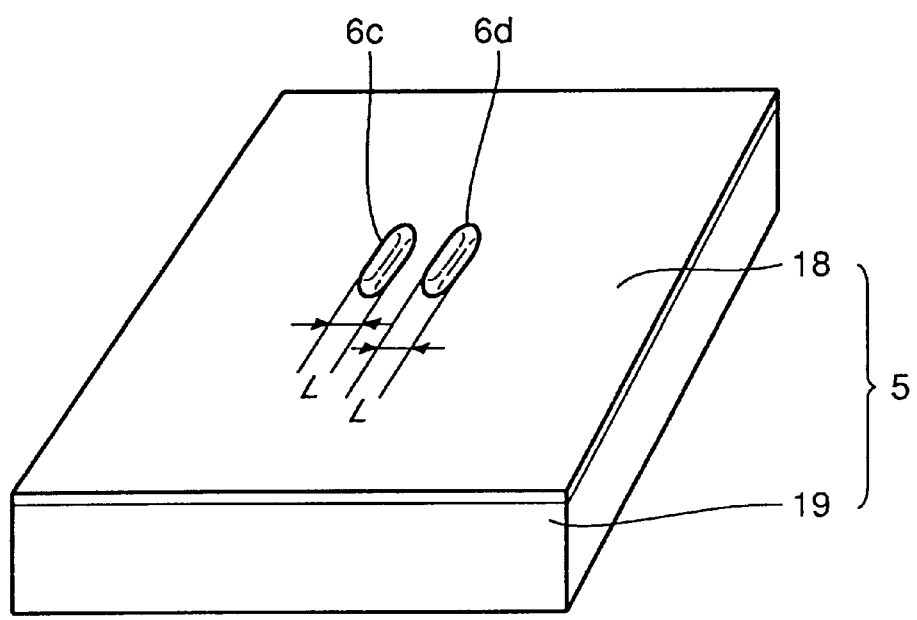
FIG. 11 is a schematic diagram for describing a probe vestige formed on an electrode of a semiconductor device by the probe needle of the second embodiment.

The leading end of a cantilever type probe needle according to a second embodiment of the present invention shown in FIGS. 9 and 10 basically has a structure similar to that of the cantilever type probe needle of the first embodiment shown in FIGS. 2 and 3. The leading end of the probe needle of the second embodiment differs from the leading end of the probe needle of the first embodiment in that groove 4 at tip 2 of the probe needle is formed at right angles to the direction of groove 4 at tip of the first embodiment shown in FIG. 3. Therefore, first and second convex portions 3c and 3d are arranged parallel in a direction orthogonal to the parallel arrangement of convex portions 3a and 3b shown in FIG. 3. Since tip 2 of the probe needle of the second embodiment includes groove 4 and first and second convex portions 3c and 3d, similar to the first embodiment, the size of convex portions 3c and 3d can be made smaller than the leading end of the conventional probe needle with one convex portion. A smaller size of convex portions 3c and 3d allows the area of contact between convex portions 3c and 3d and the surface of electrode 5 to become smaller when contact is provided between electrode 5 (refer to FIG. 11) formed of aluminum layer 19 with aluminum oxide layer 18 at the surface (refer to FIG. 11) and convex portions 3c and 3d located at tip 2 of the probe needle for the purpose of inspecting the semiconductor device. The pressure at the contact between convex portions 3c and 3d and the surface of electrode 5 can be increased in the present invention in comparison to a conventional probe needle when the same load is exerted on the probe needle. Even if the distance of travel of the probe needle in the horizontal direction on electrode 5 is reduced than a conventional one, aluminum oxide layer 18 at the surface of electrode 5 can be removed to establish contact between the underlying aluminum layer 19 and convex portions 3c and 3d. As shown in FIG. 11, the length L of probe vestiges 6c and 6d formed at the surface of electrode 5 can be reduced. Accordingly, the protuberant portion of aluminum oxide formed at the circumference of probe vestiges 6c and 6d becomes smaller. It is therefore possible to prevent the problem that the reliability of the semiconductor device is degraded caused by insufficient bonding between the bonding wire and electrode 5. The contact between electrode 5 and the probe needle can be achieved even when the aluminium oxide scraped from electrode 5 adheres to first convex portion 3c to result in insufficient contact between electrode 5 and first convex portion 3c as long as the contact between second convex portion 3d and electrode 5 is maintained. Degradation in the accuracy of the inspection of a semiconductor device using the probe needle caused by contact failure between probe needle 5 and electrode 5 can be prevented. Degradation in the reliability of the inspection per se of the semiconductor device can be prevented.

Third Embodiment

Figure 12:
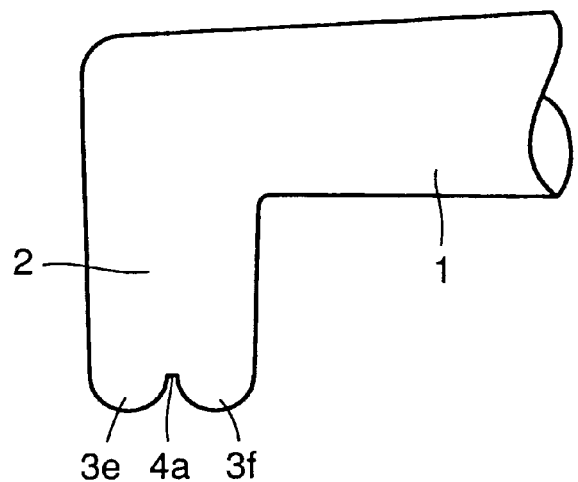
FIGS. 12, 13, and 14 are a side view, a bottom view, and a perspective view, respectively, for describing the leading end of a probe needle according to a third embodiment of the present invention.
Figure 13:
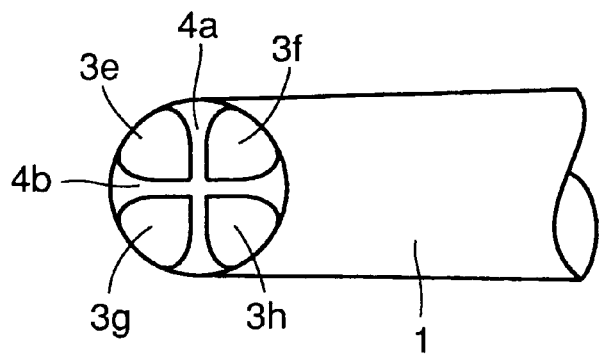
Figure 14:
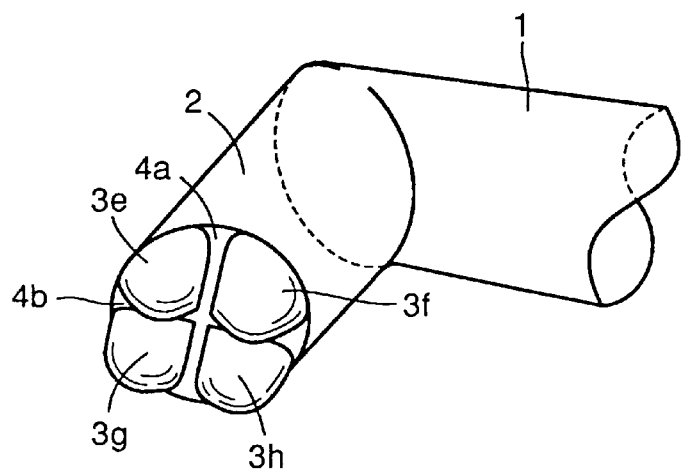
Figure 15:
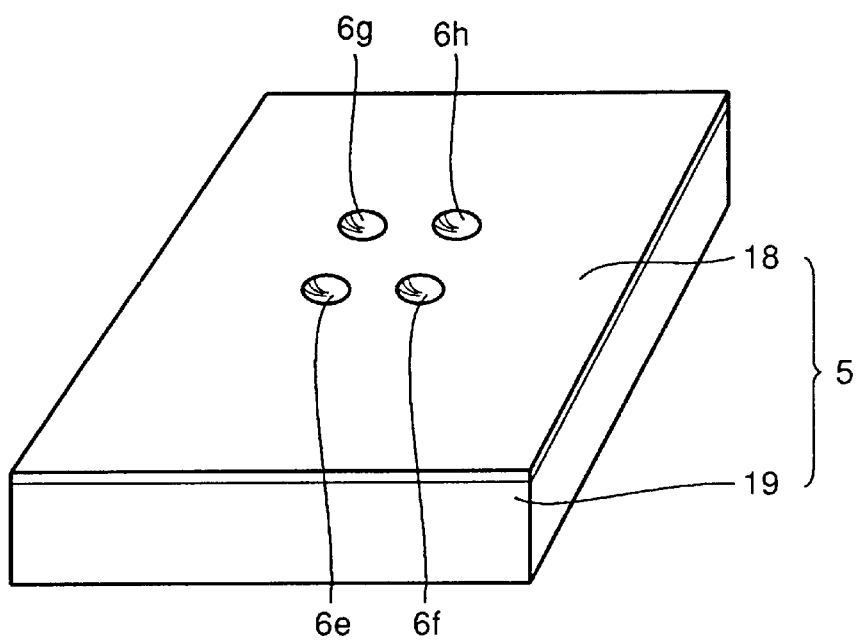
FIG. 15 is a schematic diagram for describing a probe vestige formed on an electrode of a semiconductor device by the probe needle of the third embodiment.

Referring to FIGS. 12—14, tip 2 of a cantilever type probe needle according to a third embodiment of the present invention includes a first convex portion 3e, a second convex portion 3f, a third convex portion 3g, a fourth convex portion 3h, a first groove 4a, and a second groove 4b. First to fourth convex portions 3e, 3f, 3g and 3h substantially have a round configuration. The provision of first to fourth convex portions 3e, 3f, 3g and 3h at tip 2 of the probe needle according to the third embodiment of the present invention allows the size of convex portions 3e, 3f, 3g and 3h to be reduced more than the tip of a conventional probe needle with one convex portion. The width of probe vestiges 6e, 6f, 6g and 6h formed at the surface of electrode 5 can be reduced as shown in FIG. 15 in providing contact between electrode 5 formed of aluminum layer 19 with aluminum oxide layer 18 at the surface (refer to FIG. 15) and convex portions 3e, 3f, 3g and 3h located at tip 2 of the probe needle for the purpose of inspecting the semiconductor device. A smaller size of convex portions 3e, 3f, 3g and 3h of probe needle allows the area of contact between convex portions 3e, 3f, 3g and 3h and the surface of electrode 5 to be reduced. The pressure at the contact between convex portions 3e, 3f, 3g and 3h and the surface of electrode 5 according to the probe needle of the third embodiment can be increased even when the load applied to the probe needle is the same as that of a conventional one. Therefore, even if the distance of travel of the probe needle in the horizontal direction on electrode 5 is reduced, aluminum oxide layer 18 at the surface of electrode 5 can be removed to allow the underlying aluminum layer 19 to come in contact with convex portions 3e, 3f, 3g and 3h of the probe needle. The distance of travel of the probe needle in the horizontal direction on electrode 5 can be reduced, so that the length of probe vestiges 6e, 6f, 6g and 6h on electrode 5 can be reduced. As a result, both the width and the length of probe vestiges 6e, 6f, 6g and 6h can be made smaller. Accordingly, the protuberant portion of the aluminium oxide formed around probe vestiges 6e, 6f, 6g and 6h can be reduced. The problem that reliability of the semiconductor device is degraded due to insufficient bonding between the bonding wire formed of gold and electrode 5 can be eliminated.

Even in the case where aluminium oxide scraped off electrode 5 adheres to first convex portion 3e to result in contact failure with electrode 5, contact between electrode 5 of the semiconductor device and the probe needle can be provided as long as the contact between the other second to fourth convex portions 3f, 3g and 3h and electrode 5 is maintained. Therefore, degradation in the accuracy of inspection caused by contact failure between the probe needle and electrode 5 of the semiconductor device can be prevented in the inspection process of the semiconductor device using this probe needle. Reduction in the reliability of the inspection per se of the semiconductor device can be prevented.

Figure 16:
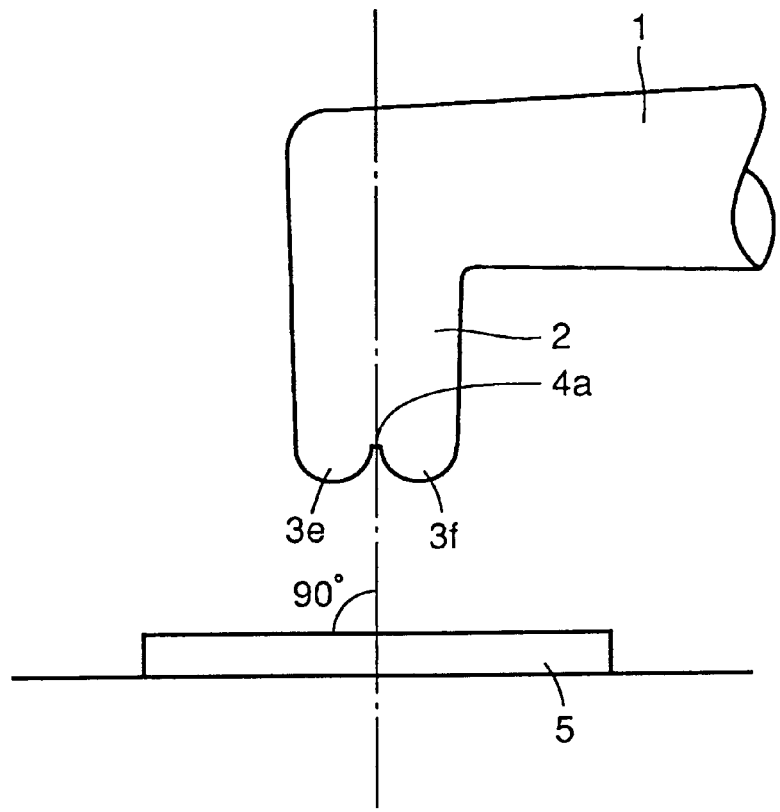
FIG. 16 is a schematic diagram for describing a control method of the probe needle of the third embodiment shown in FIG. 12.

FIG. 16 is a diagram for describing the control method of the cantilever type probe needle of the third embodiment in forming contact with electrode 5 of the semiconductor device. Control is provided so that the direction of axis of tip 2 is approximately 90 degrees to the plane where contact is provided between electrode 5 and the probe needle. This angle of approximately 90 degrees between the axial direction of tip 2 and the plane of electrode 5 in contact with the probe needle ensures the contact of first to fourth convex portions 3e, 3f, 3g and 3h of tip 2 of the probe needle with electrode 5. Even when there is a contact failure between electrode 5 and any one of the first to fourth convex portions 3e, 3f, 3g and 3h, contact between electrode 5 and the probe needle can be achieved as long as the contact between electrode and the remaining convex portions is maintained. In the process of inspection of a semiconductor device using this probe needle, degradation of the accuracy of the inspection caused by contact failure between the probe needle and electrode 5 can be prevented. It is therefore possible to prevent degradation of the reliability of the inspection itself of the semiconductor device.

Figure 17:
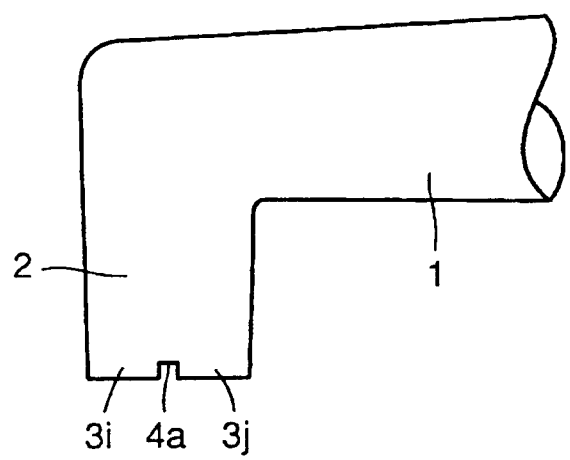
FIGS. 17 and 18 are a side view and a bottom view, respectively, for describing a modification of the probe needle of the third embodiment shown in FIG. 12.
Figure 18:
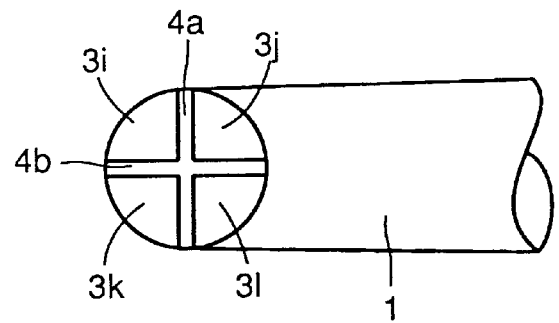
Figure 19:
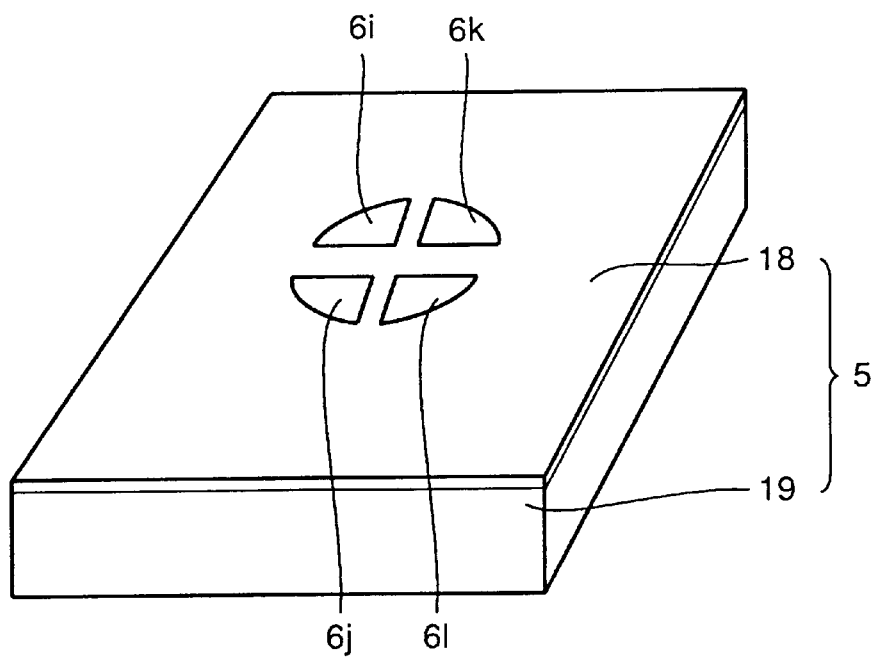
FIG. 19 is a schematic diagram for describing a probe vestige formed at an electrode of a semiconductor device by the probe needle of the modification of the third embodiment shown in FIG. 17.
Figure 20:
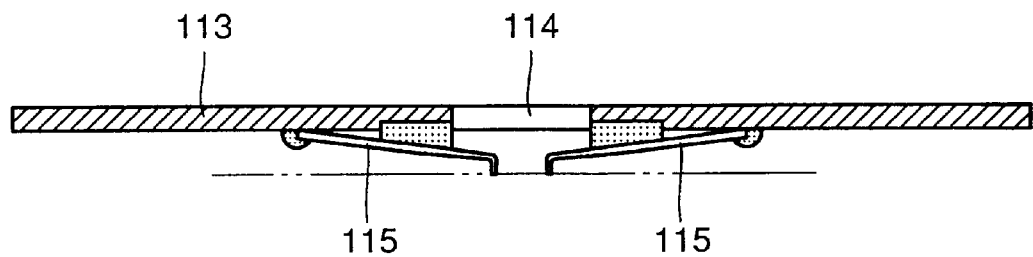
FIG. 20 is a sectional view for describing a conventional probe card.
Figure 21:
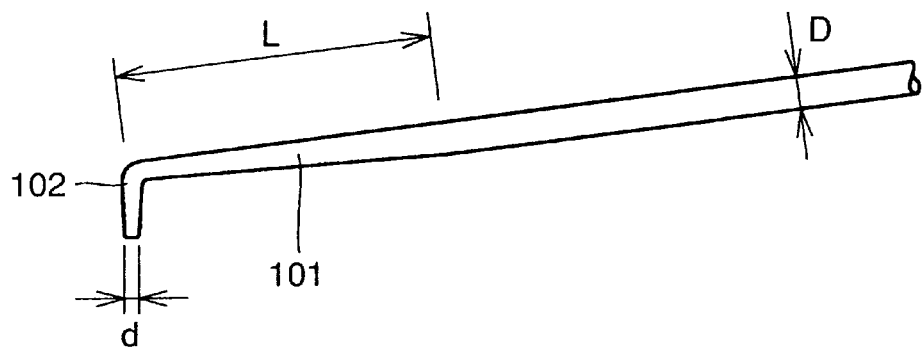
FIG. 21 is a schematic diagram for describing a conventional probe needle.
Figure 22:
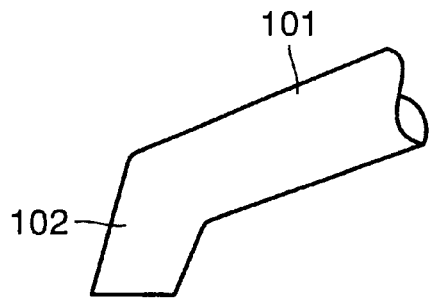
FIGS. 22 and 23 are a side view and a perspective view, respectively, for describing the leading end of a conventional blast type probe needle.
Figure 23:
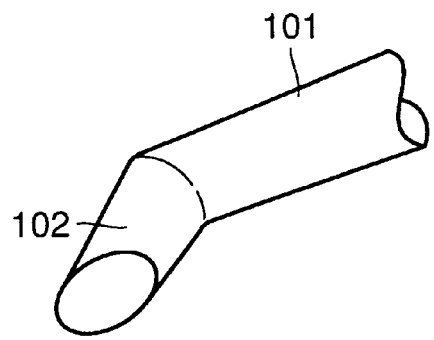
Figure 24:
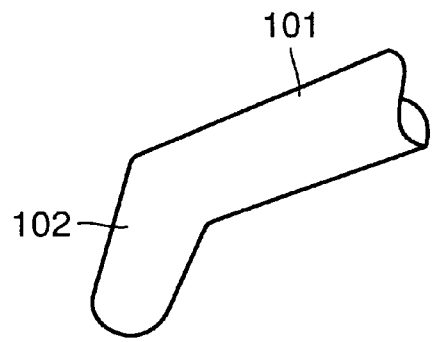
FIGS. 24 and 25 are a side view and a perspective view, respectively, for describing the leading end of a conventional specular type probe needle.
Figure 25:
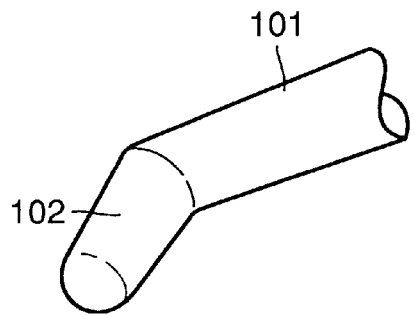
Figure 26:
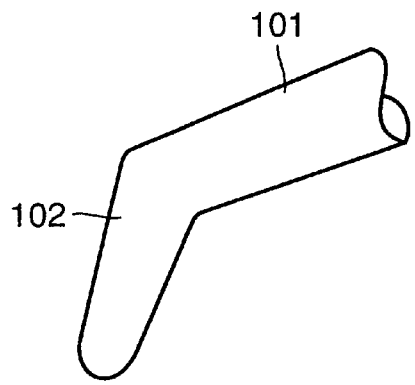
FIGS. 26 and 27 are a side view and a perspective view, respectively, for describing the leading end of a conventional spherical type probe needle.
Figure 27:
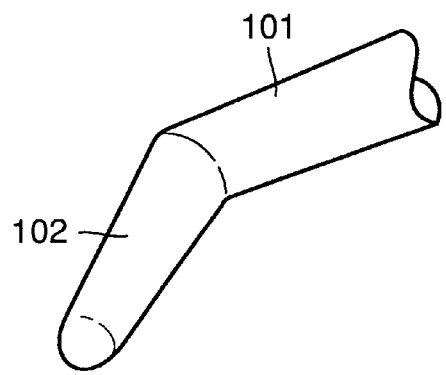

FIGS. 17 and 18 show a modification of the third embodiment of the present invention. The leading end of the cantilever type probe needle according to the present modification basically has a structure similar to that of the leading end of the probe needle of the third embodiment shown in FIGS. 12 and 13. The leading end of the probe needle of the present modification differs from the leading end of the probe needle of the third embodiment in that convex portions 3i, 3j, 3k and 3l have substantially a plane configuration. By virtue of the plane configuration, the leading end of the probe needle can be prevented from excessively projecting into electrode 5 when electrode 5 of the semiconductor device is depressed towards the probe needle to result in formation of probe vestiges 6i, 6j, 6k and 6l as shown in FIG. 19. The problem of the leading end of the probe needle reaching another element of the semiconductor device located beneath electrode 5 to damage the element can be prevented.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A cantilever type probe needle for a probe card comprising:

a first convex portion at a leading end of the probe needle, and a second convex portion formed apart from said first convex portion at the leading end of the probe needle with a groove therebetween.

2. The cantilever type probe needle according to claim 1, wherein said convex portion has substantially a round configuration.

3. The cantilever type probe needle according to claim 1, wherein said convex portion has substantially a plane configuration.

4. A method of controlling a relative movement between a surface of a semiconductor device and a cantilever type probe needle having at its leading end a first convex portion and a second convex portion formed apart from said first convex portion with a groove therebetween, comprising the step of contacting both said first and second convex portions with said surface of the semiconductor device.

* * * * *